(12) United States Patent
Okabe et al.

(10) Patent No.: US 6,535,778 B2
(45) Date of Patent: Mar. 18, 2003

(54) PROCESS CONTROL METHOD AND PROCESS CONTROL APPARATUS

(75) Inventors: Masataka Okabe, Hyogo (JP); Hirofumi Ohtsuka, Hyogo (JP); Taichi Yanaru, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 98 days.

(21) Appl. No.: 09/793,736

(22) Filed: Feb. 27, 2001

(65) Prior Publication Data

US 2002/0120357 A1 Aug. 29, 2002

(30) Foreign Application Priority Data

Aug. 24, 2000 (JP) ........................................ 2000-254317

(51) Int. Cl.[7] ................................................. G06F 7/00
(52) U.S. Cl. ...................... 700/112; 700/115; 700/121; 700/99; 700/100; 700/101; 700/102
(58) Field of Search ................................ 700/112, 115, 700/121, 99–102, 219

(56) References Cited

U.S. PATENT DOCUMENTS 5,375,061 A * 12/1994 Hara et al. ................. 438/980
5,668,733 A * 9/1997 Morimoto et al. ...... 414/222.13
6,351,686 B1 * 2/2002 Iwasaki et al. ............. 700/121
6,397,119 B1 * 5/2002 Marume et al. ............ 700/121

FOREIGN PATENT DOCUMENTS

| JP | 6-251028 | 9/1994 |
|---|---|---|
| JP | 8-179808 | 7/1996 |
| JP | 9-45596 | 2/1997 |
| JP | 11-184925 | 7/1999 |

* cited by examiner

Primary Examiner—Leo Picard
Assistant Examiner—Michael D. Masinick
(74) Attorney, Agent, or Firm—Leydig, Voit & Mayer, Ltd.

(57) ABSTRACT

In a process control method, when $T_1+Tw+T_2<Td$ is satisfied, where a time obtained by adding a conveyance time from a hold stocker to the pre-treatment processing equipment to a waiting time until start of a pre-treatment is $T_1$, treatment time in the pre-treatment processing equipment is Tw, storage time from completion of the process in the pre-treatment processing equipment to starting of charging into a post-treatment is $T_2$, and treatment time in the post-treatment equipment is Td, a point of time $TR_1$ when the treatment of a lot 1 is started in the post-treatment equipment is utilized as a trigger, and a lot 2 is charged after a predetermined standby time $Ta_1$ so that a point of time when the treatment time Td of the lot 1 has been completed in the post-treatment equipment may almost coincide with the point of time when the treatment time Td of the lot 2 is started in the post-treatment equipment.

8 Claims, 7 Drawing Sheets

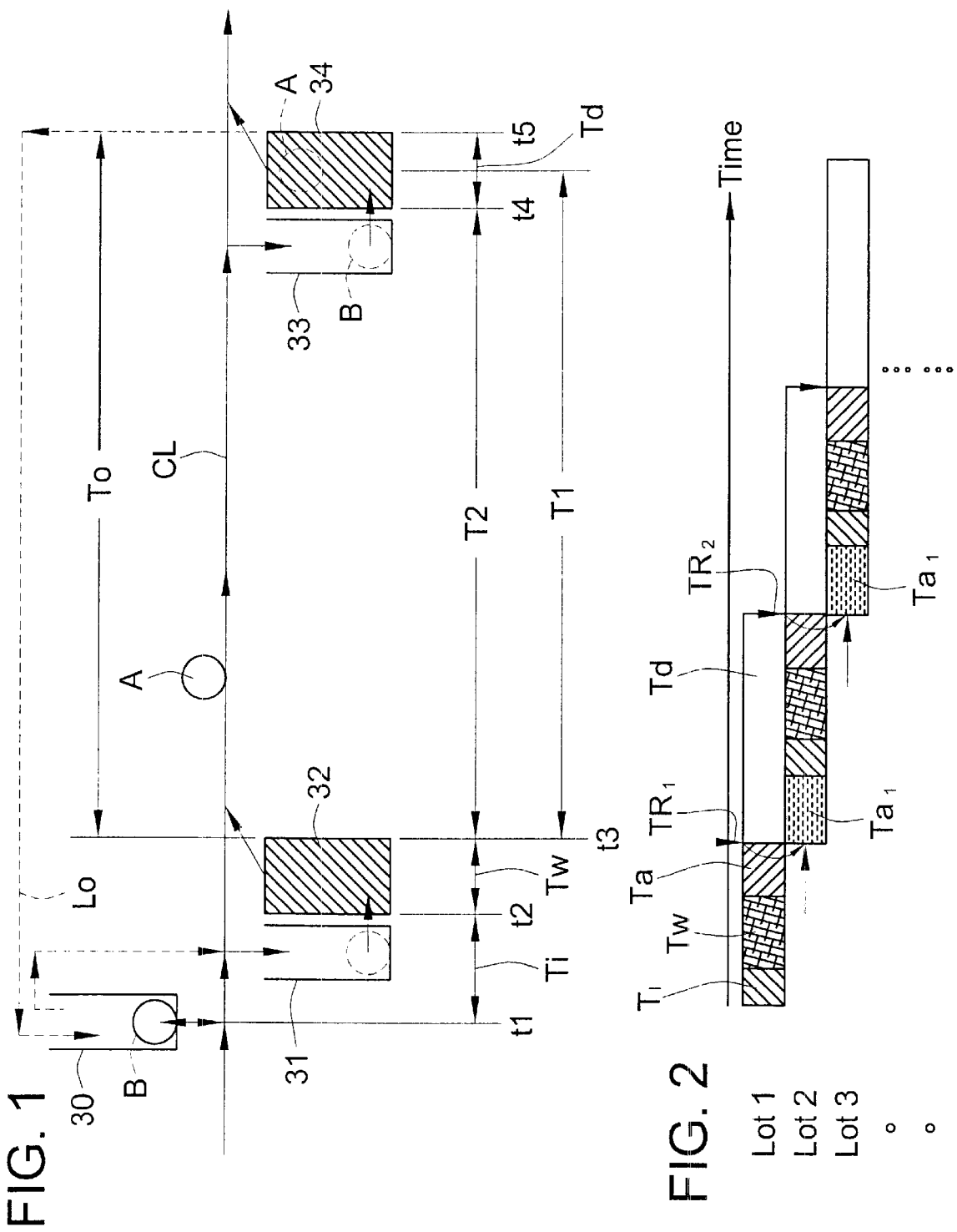

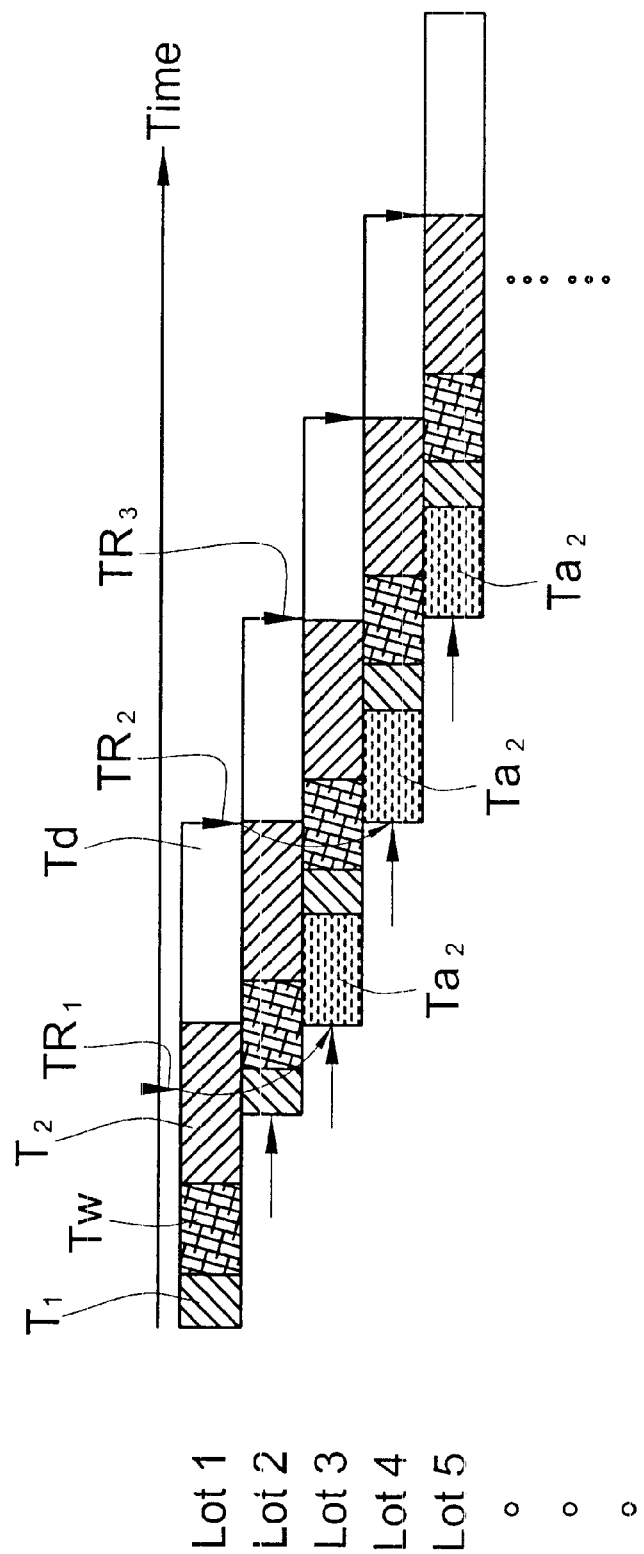

PROCESS CONTROL METHOD AND PROCESS CONTROL APPARATUS

BACKGROUND OF THE INVENTION

1. Technical Field

The present invention relates to a process control method and a process control apparatus for semiconductor wafers or the like and, in particular, to a process control method and a process control apparatus at a process stage in which storage time between completion of pre-treatment and start of post-treatment is limited. More specifically, the invention relates to a process control method and a process control apparatus designed to achieve an efficient process flow and achieve an improvement in productivity by sequentially starting charging for a subsequent lot into the pre-treatment process, while controlling the starting point of charging on the basis of the starting point of post-treatment by post-treatment processing equipment, to eliminate excess products in-process over the time limit, when the storage time before starting the post-treatment process by the post-treatment processing equipment after completing the pre-treatment process by the pre-treatment processing equipment is limited.

2. Background Art

Hitherto, a well-known production system has been proposed, in which, upon completing a process for any product at a given stage, the product is transferred to a buffer for the next stage to start a new operation. For example, production control equipment which performs acceptance control and subsequent control of objects to be processed between stages in such a system was proposed in the Japanese Laid-opened Patent No. 8-179808. This prior art discloses production control equipment in which production control is conducted by the steps of: obtaining a list of operations undergone in the process previous to the current process to which an operation start request was given; requesting the previous process to start an operation in the order of priority if the previous process has a standby lot; inquiring of the previous process whether or not there are any available work resources; instructing the previous process to start a new operation if the work resources are available for the new operation; and requesting the previous process to supply the lot to the current process as early as possible.

Now, in the wafer processing of semiconductor devices, for example, a wet process (pre-treatment process) and a film formation process (post-treatment process) are conducted repeatedly for every mask, which is composed of ten through over twenty sheets. In the film formation process requiring particularly strict control of film formation accuracy, it is essential to strictly control the storage time of a semiconductor wafer from completion of the wet process to start of the film formation process. Because, if the storage time of semiconductor wafer is prolonged, dirt on the surface, metal contamination, organic material contamination, damaged layers or natural oxide layers on the surface, which were laboriously removed by the wet equipment, are reproduced on the surface of the wafer during storage of the wafers, and if a film formation process is applied to such a contaminated surface it is impossible to manufacture ICs having a predetermined quality.

As described above, if it is established that the storage time of a product from completion of the pre-treatment process to start of the post-treatment process should be within 4 hours, for example, it is necessary to start the post-treatment process within 4 hours. However, for example, since the process capacity of the film formation equipment (hereinafter also referred to as storage time observation processing equipment) during the post-treatment process varies depending on the passage of time. Therefore, if the treatment time using the film formation equipment is prolonged, the aforementioned conventional production control system cannot function sufficiently without holding excess products in-pending in the post-treatment process. Moreover, if the number of excess products in-process exceeds the processing capacity of the post-treatment equipment, the remaining products cannot start to undergo any treatment within the storage time observation period limit (hereinafter referred to as specified time) $T_l$ (for example, 4 hours). Accordingly, a problem exists in that untreated products come out one after another over the specified time, and it is required to apply a re-treatment of the process to the lot (hereinafter referred to as product). On the other hand, if the post-treatment equipment does not have any excess product in-process, a next coming lot is charged into the post-treatment process by hastening the treatment of the lot capable of being treated in the previous process simultaneously with the start of the post-treatment process. Therefore, a further problem exists in that if any post-treatment equipment is low in its processing capacity and has a production bottleneck, the post-treatment process is not started and suspension of production continues until the subsequent lot is transferred to the post-treatment process, which further prolongs the overall treatment time through the entire system, eventually resulting in lowering of productivity.

SUMMARY OF THE INVENTION

The present invention was made to resolve the above-discussed problems and has an object of providing a process control method and a process control apparatus capable of achieving the most efficient process flow for post-treatment equipment having a bottleneck, and increasing productivity by eliminating any excess product in-process which requires re-treatment while taking balance of the process capacity for the post-treatment equipment into consideration to determine appropriately optimum number of products in-process so as not to exceed a specified time $T_l$.

To accomplish the foregoing object, the invention provides a process control method, for processing a plurality of lots including a preceding lot and a subsequent lot in a process stage comprising a hold stocker for holding each lot in a standby state, a pre-treatment processing equipment for pre-treating each lot brought out from said hold stocker on the basis of a standby release order, and a post-treatment processing equipment for post-treating each lot of which pre-treatment has completed, wherein a storage time for each lot between completion of pre-treatment in said pre-treatment processing equipment and start of post-treatment in said post-treatment processing equipment is limited, the process control method comprising: a step of establishing a standby time for the subsequent lot on the basis of the treatment starting time for the preceding lot in said post-treatment processing equipment so that completion time of the post-treatment for the preceding lot in said post-treatment processing equipment may substantially coincide with the starting time of the post-treatment for the subsequent lot in said post-treatment equipment; and a step of giving said standby order for the subsequent lot after elapsing the standby time utilizing the start of the treatment for the preceding lot in said post-treatment processing equipment as a trigger.

It is preferable that, in the process control method according to the invention, $T_1+Tw+T_2<Td$ and $Ta_1=Td-T_1-Tw-T_2$ are satisfied, supposing that the mentioned preceding lot is a first lot and the mentioned subsequent lot is a second lot to be treated subsequently, and establishing that a time obtained by adding a conveyance time from said hold stocker to said pre-treatment processing equipment to a waiting time until start of the pre-treatment is $T_1$, a treatment time in the mentioned pre-treatment processing equipment is Tw, the storage time is $T_2$, a treatment time in said post-treatment equipment is Td, and said standby time for each lot on and after the second lot is $Ta_1$.

It is preferable that, in the process control method according to the invention, the second lot has a lot number subsequent to a lot number of the first lot.

It is preferable that, in the process control method according to the invention, $T_1+Tw+T_2>Td$ and $Ta_2=2\times Td-T_1-Tw-T_2$ are satisfied, supposing that the mentioned preceding lot is a first lot and the subsequent lots are second and third lots to be treated subsequently, and establishing that a time obtained by adding a conveyance time from said hold stocker to said pre-treatment processing equipment to a waiting time until start of pre-treatment is $T_1$, a treatment time in the mentioned pre-treatment processing equipment is Tw, the storage time is $T_2$, a treatment time in the mentioned post-treatment equipment is Td, and the standby time of each lot on and after the third lot is $Ta_1$.

It is preferable that in the process control method according to the invention, the third lot has an alternate lot number to a lot number of the first lot.

The invention also provides a process control apparatus for processing a plurality of lots including a preceding lot and subsequent lot, comprising a hold stocker for holding each lot in a standby state, a pre-treatment processing equipment for pre-treating each lot brought out from said hold stocker on the basis of a standby release order, and a post-treatment processing equipment for post-treating each lot of which pre-treatment has completed, wherein a storage time for each lot between completion of pre-treatment in said pre-treatment processing equipment and start of post-treatment in said post-treatment equipment is limited, the process control apparatus further comprises: an information storage section for storing information on a standby time for the subsequent lot on the basis of the starting time of the treatment of the preceding lot in said post-treatment processing equipment so that completion time of post-treatment of the preceding lot in said post-treatment processing equipment may substantially coincide with the starting time of post-treatment of the subsequent lot in said post-treatment processing equipment, information on the treatment starting time for the preceding lot in the said post-treatment processing equipment, and product request information for the subsequent lot; an FA computer including an arithmetic unit control section for calculating the standby time of the subsequent lot in accordance with an automatic program using said information on the standby time, said information on the treatment starting time, and said product request information, and for transmitting standby release order for the subsequent lot after elapsing the standby time; and an equipment control terminal which transfers said standby release order to said pre-treatment processing equipment.

It is preferable that, in the process control apparatus according to the invention, $T_1+Tw+T_2<Td$ and $Ta_1=Td-T_1-Tw-T_2$ are satisfied, supposing that the preceding lot is a first lot and the subsequent lot is a second lot to be treated subsequently, and establishing that a time obtained by adding a conveyance time from said hold stocker to said pre-treatment processing equipment to a waiting time until start of pre-treatment is $T_1$, a treatment time in said pre-treatment processing equipment is Tw, the storage time is $T_2$, a treatment time in said post-treatment equipment is Td, and said standby time of each lot on and after the second lot is $Ta_1$.

It is preferable that, in the process control apparatus according to the invention, the second lot has a lot number subsequent to a lot number of the first lot.

It is preferable that, in the process control apparatus according to the invention, $T_1+Tw+T_2>Td$ and $Ta_2=2\times Td-T_1-Tw-T_2$ are satisfied, supposing that the preceding lot is a first lot and the subsequent lots are second and third lots to be treated subsequently, and establishing that a time obtained by adding a conveyance time from said hold stocker to said pre-treatment processing equipment to a waiting time until start of pre-treatment is $T_1$, a treatment time in said pre-treatment processing equipment is Tw, the storage time is $T_2$, a treatment time in said post-treatment processing equipment is Td, and said standby time of each lot on and after the third lot is $Ta_1$.

It is preferable that, in the process control apparatus according to the invention, the third lot has an alternate lot number of a lot number of the first lot.

In the process control method and process control apparatus of above arrangement, following advantages are achieved.

Since in the process control method and the process control apparatus, the standby time for the subsequent lot is established on the basis of the treatment starting time of the preceding lot in said post-treatment processing equipment so that completion time of post-treatment for the preceding lot in said post-treatment processing equipment may almost coincide with the starting time of post-treatment for the subsequent lot in said post-treatment processing equipment, and the standby order given to the subsequent lot is released after elapsing the standby time utilizing the start of the treatment of the preceding lot as a trigger, it becomes possible to avoid re-treatment due to excess products in-process of which standby time has lapsed before the post-treatment process.

Further, in the process control method and the process control apparatus of above arrangement, the post-treatment processing equipment can be continuously and efficiently operated without any idle conditions and in addition. Since the time for keeping the lot, of which pre-treatment had been conducted using the pre-treatment processing equipment, in the storage period observation stage can be reduced, it becomes possible to produce products of high quality with high productivity.

Further, since the second lot has a lot number subsequent to the lot number of a fist lot which is a reference for establishing the standby time until charging the second lot, the invention performs the mentioned advantage particularly when the method and the apparatus are applied to the case wherein the treatment time in the post-treatment using the post-treatment processing equipment is longer than the required time from the release of the pending treatment to the start of charging into the pre-treatment processing equipment.

Furthermore, since the third lot has an alternate lot number to the lot number of the first lot which is a reference for establishing the standby time until charging the third lot, the invention performs the mentioned advantages particularly when the method and the apparatus are applied to the case wherein the time in the post-treatment using the post-treatment equipment is longer than the required time from the release of the pending treatment to the start of charging into the pre-treatment processing equipment.

BRIEF DESCRIPTION OF THE DRAWINGS

FIG. 1 is a schematic diagram showing an arrangement of the apparatus and the process flow in a process stage according to Embodiment 1 of the present invention.

FIG. 2 is a treatment time schedule chart for each lot in the process flow in FIG. 1.

FIG. 9 is a treatment time schedule diagram for each lot in the process flow in a process stage according to Embodiment 2 of the invention.

DESCRIPTION OF THE PREFERRED EMBODIMENTS

Figure 3:
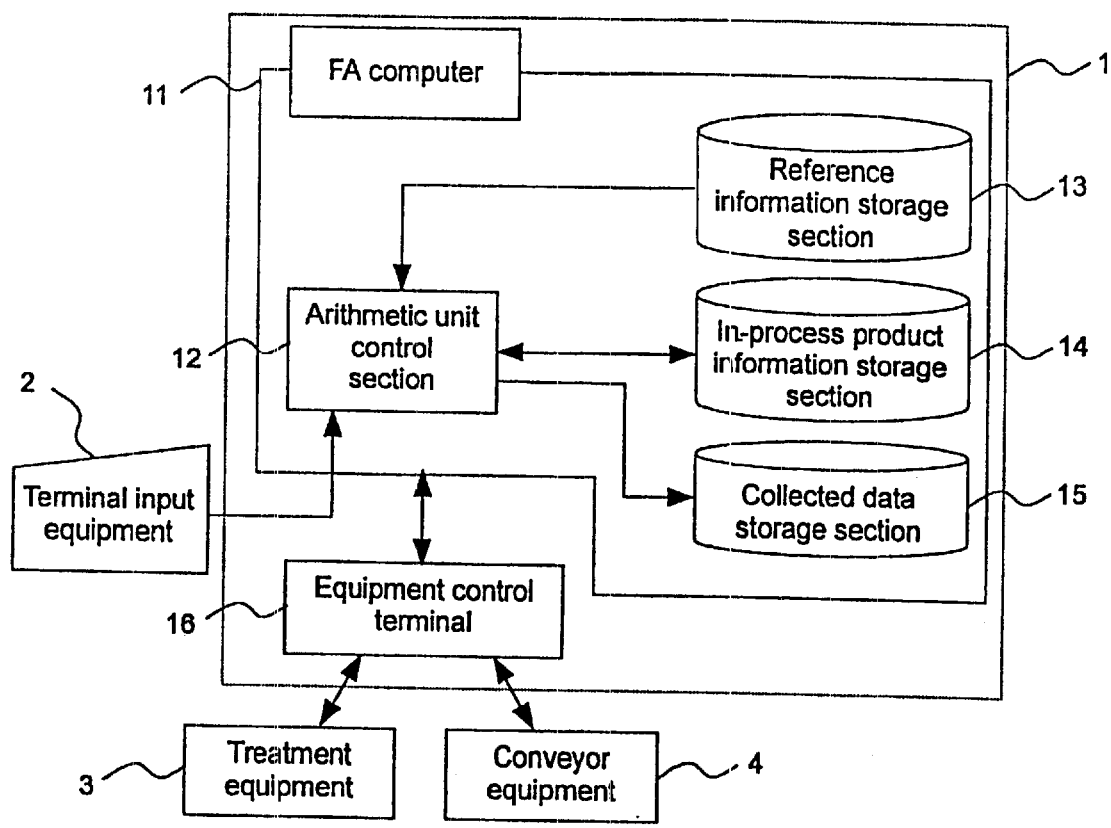
FIG. 3 is a block diagram showing an arrangement of the process control apparatus according to Embodiment 1 and Embodiment 2.

Embodiment 1.

Embodiment 1 according to the present invention is hereinafter described with reference to the accompanying drawings. FIG. 1 is a diagram showing an arrangement of a process stages requiring observation of a storage time of semiconductor wafers among semiconductor wafer treatment processes to be controlled in the invention.

The process stages in FIG. 1 are mainly composed of a pre-treatment processing equipment 32 and a post-treatment processing equipment 34. More specifically, the pre-treatment processing equipment 32 is a cleaning equipment for semiconductor wafers, by which semiconductor wafers are cleaned. The pre-treatment conducted by the pre-treatment processing equipment 32 is a WET treatment, which means start of a storage time for the semiconductor wafers. Therefore, the mentioned treatment is referred to as a storage time start treatment, and the process for conducting the pre-treatment is also referred to as a storage time starting process. The pre-treatment processing equipment 32 is also referred to as storage time start processing equipment. The post-treatment equipment 34 is a film formation equipment for the semiconductor wafers, by which a film having a predetermined material is formed on the surface of the semiconductor wafers cleaned by the pre-treatment. The post-treatment using the post-treatment processing equipment 34 is conducted while observing a storage time of the semiconductor wafers, and therefore the post-treatment processing s referred to as storage time observation treatment, the post-treatment process is also referred to as storage time observation process, and the post-treatment processing equipment 34 is also referred to as storage time observation processing equipment.

The treatment at the process stage in FIG. 1 is conducted for each lot. Each lot consists of plural semiconductor wafers, which are treated all at once. The stocker 31 waiting for WET treatment (hereinafter referred to as wait stocker) and the stocker 30 waiting for storage control (hereinafter referred to as hold stocker) are both disposed at the stage previous to the pre-treatment processing equipment 32. The wait stocker 31, which charges a lot into the pre-treatment processing equipment 32, is disposed immediately before the pre-treatment processing equipment 32. The hold stocker 30 stores a lot whose treatment is pending. In addition, disposed immediately before the post-treatment processing equipment 34 is the stocker 33 for wafers waiting for film formation treatment. These treatment processing equipments 32 and 34, and stockers 30, 31 and 33 are provided with a common conveyance line CL by which each lot is conveyed between the treatment processing equipments and the stockers. The left end of the conveyance line CL leads to the previous process stage in FIG. 1., and the right end leads to the subsequent process stage.

FIG. 2 is a treatment time schedule chart for each lot at the process stage in FIG. 1. As shown in FIG. 1, the lot of which treatment process before the WET treatment has completed is conveyed through the conveyance line CL. At first, the lot is stored in the stocker 30 waiting for storage control (hereinafter referred to as the hold stocker) in which treatment of any lot being in-pending in the storage time starting process is left pending. Then, at the time when starting a storage time observation period by charging the preceding lot A into the film formation equipment 34, a product request for the subsequent lot B is prepared. Information is registered on a lot whose pending treatment should be released after elapsing the required standby time $Ta_1$ from the time when the mentioned product request has been registered. When reaching such a time, the lot B is released from the pending state of treatment. Then, when it is confirmed that the stocker 31 waiting for WET treatment (hereinafter referred to as wait stocker) is idle, the lot B is taken out from the hold stocker 30 and moved to the wait stocker 31, thus the lot B is in a position of waiting for the lot request from the WET equipment 32. Reference numeral $T_1$ indicates a time including the time required to convey a lot from the hold stocker 30 to the wait stocker 31 and the waiting time in the wait stocker 31. When a product request is delivered by the WET equipment 32, the lot B is brought into the WET equipment 32, which starts the storage time starting process (WET treatment). Simultaneously with the completion of the WET treatment (WET treatment time is indicated by Tw), counting of storage time observation period starts.

The lot A of which treatment has completed in advance using the WET equipment 32 is conveyed through the conveyance line CL toward the stocker 33 waiting for film formation treatment. Shortly after the lot A arrives at the stocker 33 waiting for film formation treatment, the mentioned standby time Ta, is preset to allow the lot A being brought into the film formation equipment 34, in replace of a lot of which film formation treatment has completed (time for film formation treatment is indicated by Td) so as to start the film formation treatment. The mentioned relation is shown in the drawing by the one-dot-chain line such that the lot B is going to be brought into the film formation equipment 34 shortly after the lot B arrives at the stocker 33 waiting for film formation treatment and that the lot A whose film formation treatment has completed by the film formation equipment 34 is going to be brought out of the film formation equipment 34.

In addition, the time required for treating one lot in each treatment process is, for example, approximately 45 minutes for WET treatment, approximately 15 minutes for conveyance between the WET equipment 32 and the stocker 33 waiting for film formation treatment, and approximately 3 hours for film formation. At this time, the storage time $T_2$ from the completion of WET treatment process (storage time starting process) to the start of bringing into the film formation equipment 34 is required to be less than 4 hours (storage time observation period limit). This time limit is preliminarily set as a specified time $T_l$. Upon starting the film formation treatment, counting of the storage time observation period is stopped and the observation period is calculated. If lapsing the preset specified time, the lot is conveyed to the hold stocker 30, where the lot is subject to re-treatment in the same manner as described above along with the re-treatment flow. Note that the re-treatment flow is established to cope with lapse of the specified time $T_l$ in the event of occurring unexpected troubles in the treatment equipment at the storage time observation stage.

The product request to the subsequent lot is prepared simultaneously with the start of film formation treatment. In the same manner as described above, after elapsing the required standby time $Ta_1$ from the point when the request is prepared, the subsequent lot is brought out from the hold stocker 30 into the WET equipment 32 through the wait stocker 31. Thus, the same treatment is automatically repeated sequentially in order. The lot of which film formation treatment has completed is brought into the next process through the conveyance line. FIG. 2 shows a treatment time schedule for each lot under the mentioned treatment flow. Referring to FIG. 2, the time for the subsequent lot is automatically counted utilizing the starting time of the storage time observation process of the preceding lot as a trigger (that is, the lot 2 is counted based on TR1 of the lot 1 as a trigger and the lot 3 is counted based on TR2 of the lot 2 as a trigger). After elapsing the standby time $Ta_1$, the lot B of which treatment is pending in the hold stocker 30 is brought out from the hold stocker 30 and is subject to the storage time starting process. However, the WET treatment time Tw and the required time for conveyance to the stocker 33 waiting for film formation treatment is generally short as compared with the time Td required for film formation treatment. Therefore, a point of time when the subsequent lot arrives at the stocker 33 waiting for film formation treatment coincides with a point of time when film formation treatment for the preceding lot has completed. This allows the consecutive treatment using the film formation equipment 34 without any intervals as shown in the drawing. Note that the mentioned operation can be available under the conditions that the post-treatment time Td using the film formation equipment 34 is longer than the total time (sum) obtained by adding the time $T_1$ of conveyance time from the hold stocker 30 to the WET equipment 32 to the waiting time of the WET equipment 32, the WET treatment time Tw and storage time $T_2$ from completion of the WET g treatment until start of charging into the film formation equipment 34 including the conveyance time. In other words, the operation is available when the following relation is satisfied: $T_1+Tw+T_2<Td'$ where: the standby time $Ta_1=Td-T_1-Tw-T_2$.

In addition, in FIG. 1, reference numeral t1 indicates a point of time when a lot starts to be conveyed on the conveyance line CL after the pending treatment conditions in the hold stocker 30 is released. Numeral t2 indicates a point of when the WET equipment 32 starts to clean the lot. Numeral t3 indicates a point of time when the cleaning treatment has completed using the WET equipment 32. Numeral t4 indicates a point of time when a film formation treatment has started using the film formation equipment 34, and numeral t5 indicates a point of time when film the formation treatment has completed.

In addition, $T_O$ indicates a time exceeding the storage time observation period limit $T_l$ (overtime) and the one-dot-chain line $L_O$ indicates the re-treatment flow of the lot whose treatment time is over the storage time observation period limit time $T_l$ (specified time).

As described above, by placing lots in-process in the locations before the waiting stocker 31 and not placing them in the stocker 33 waiting for film formation treatment, it becomes possible for the film formation equipment 34 to operate continuously and efficiently without idling in sequence. Furthermore, the time when the lot of which cleaning treatment has completed using the WET equipment 32 is required to be left for a short time at the storage time observation stage. Therefore, there is no more re-treatment of excess products in-process due to time over of specified time $T_l$, and it becomes possible to produce products of superior quality with high productivity.

Figure 4:
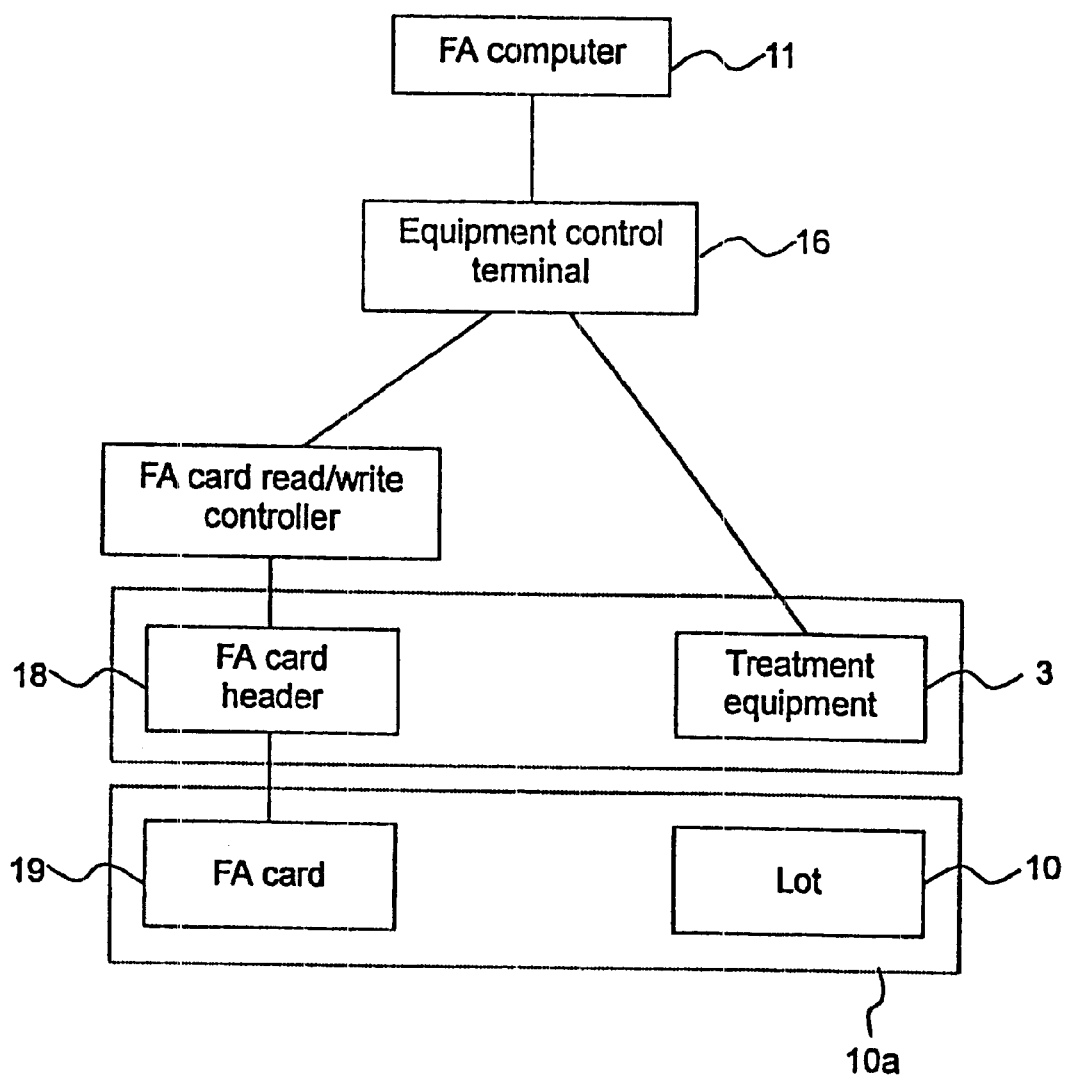
FIG. 4 is a block diagram showing an arrangement in which an equipment control terminal for the process control apparatus exchanges information with a processing equipment and a lot.

A series of the treatment processes in the mentioned storage time observation stage is conducted in accordance with an automatic control program using a process control apparatus. FIG. 3 is a block diagram showing an arrangement of the process control apparatus which carries out a series of treatment processes in the mentioned storage time observation stage. FIG. 4 is a block diagram showing an arrangement in which equipment control terminal for the process control apparatus exchanges information with a processing equipment and a lot shown in FIG. 3.

The process control apparatus 1 is provided with a FA computer 11 (host computer for controlling factory) and equipment control terminal 16. The FA computer 11 includes a reference information storage section 13, a product in-process information storage section 14, a collected data storage section 15, and an arithmetic unit control section 12. The reference information storage section 13 is a section for storing lot treatment flow information serving as treatment process information in association with the lot until the completion of product, definition information such as names of equipment to be used in the storage time observation process (registered equipment list DB3), time waiting for next product request, time for abandoning combination of next product requests, number of combinations of products, stocker waiting for treatment, stocker for the product of which treatment is pending, and reference information such as treatment conditions in the treatment process. The product in-process information storage section 14 is a section for storing product in-process information representing location and condition of lot, such as a list DB1 of the products of which treatment is pending, a list DB2 of the products in-process, a list of product requests DB4, information on the products to be subject to the storage time treatment, QUE waiting for treatment, QUE of which treatment is pending, and information on work in-process, and control information to be prepared on the basis of the process progress information such as charging of lot into any process, start of any process, start of conveyance of lot, and completion of conveyance of lot. The collected data storage section 15 stores number of results of actual treatment, the arithmetic unit control section 12 performs arithmetic operation and controls the lot in the treatment process while referring to various information in each of these information sections 13, 14, and 15, preparing and updating information. In addition, the process progress information is automatically updated at the time of charging a lot into a process, starting a process, starting conveyance of lot and completing the conveyance of lot. It is also possible for the process progress information to be updated directly by operator using the terminal input equipment 2. Control information is periodically updated depending upon change in control conditions of the treatment processing equipment 3 and the conveyance equipment 4.

Then, arrangement between the equipment control terminal 16 and the treatment processing equipment 3 is hereinafter described. FIG. 4 is a diagram showing a mechanism through which the equipment control terminal of the process control apparatus exchanges information with the processing equipment and lot shown in FIG. 3. In the drawing, stockers, etc. are omitted. In order to produce semiconductor devices, 25 pieces of wafers are put in a cassette 10*a* for exclusive use in wafer, and these wafers are referred to as 1 lot. A product number (key No.) is designated to each lot 10, and the lot is controlled by the product number. An FA card (commercial product) 19 to store key No., next treatment schedule process, etc. is attached to each cassette 10*a*. An FA card header (commercial product) 18 is attached to each treatment processing equipment 3 to exchange information with the FA card 19 by optical communication. In this manner, the treatment is conducted while mutually transmitting and receiving the following information.

(1) At the time of starting the treatment, the charging button of the FA card 19 is depressed to start the treatment, after the lot 10 is mounted on the treatment processing equipment 3. The FA card 19 informs the FA card header 18 and the FA card read/write controller 17 that the lot 10 is mounted on the treatment processing equipment 3. An FA card read/write controller 17 converts the received optical signal into an electrical signal and informs it to the equipment terminal 16.

(2) The equipment control terminal 16 judges whether or not conditions of the treatment processing equipment 3 are available for the treatment, and if available, requests the FA computer 11 to start the treatment. Operator registers conditions of the treatment processing equipment 3.

(3) The FA computer 11 judges whether or not the conditions of the treatment processing equipment 3 are available for the treatment in accordance with the key No. as well as whether or not the treatment process is correct by retrieving the reference information. If it is possible to start treatment, the FA computer informs the equipment control terminal 16 of the control conditions set into the reference information.

(4) The equipment control terminal 16 receives the mentioned information from the FA computer 11 and delivers the request for starting the treatment to the processing equipment 3. In addition, communication between the equipment control terminal 16 and the processing equipment 3 is conducted using the SECS (Semiconductor Electronic Communication Standards) or the MSEC (Mitsubishi Semiconductor Electronic Communication Standard).

(5) The treatment processing equipment 3 receives the request for starting the treatment from the equipment control terminal 16 and starts the treatment of the lot 10 mounted on the treatment processing equipment 13.

(6) Upon completing the treatment, the treatment processing equipment 13 delivers a report on the completion of treatment to the equipment control terminal 16. The equipment control terminal 16 that received the report on the completion of treatment delivers the report on the completion of treatment to the FA computer 11.

(7) The FA computer 11 that received the report on completion of treatment from the equipment control terminal 16 stores completion data of the lot 10 and moves the lot 10 to the next treatment process. When the FA computer 11 completes data processing, the FA computer delivers information on the completion of data processing and the next treatment process to the equipment control terminal 16.

(8) The equipment control terminal 16 that received the mentioned report delivers the information on the next treatment process to the FA card read/write controller 17. The FA card read/write controller 17 that received the information rewrites the FA card 19.

(9) A series of treatments are completed at the time when the FA card 19 has been rewritten and the lot 10 mounted on the treatment processing equipment 3 is conveyed to the next treatment process.

Figure 5:
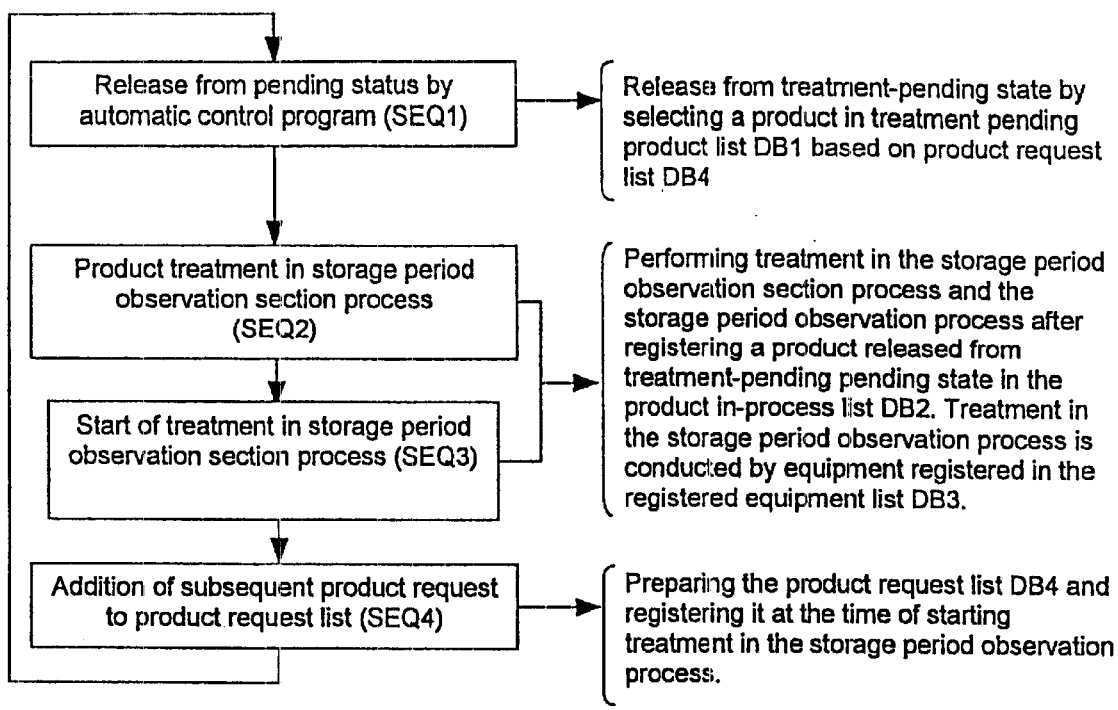
FIG. 5 is a flow diagram showing a treatment outline of the product in-process control using the process control apparatus in FIG. 3.
Figure 6:
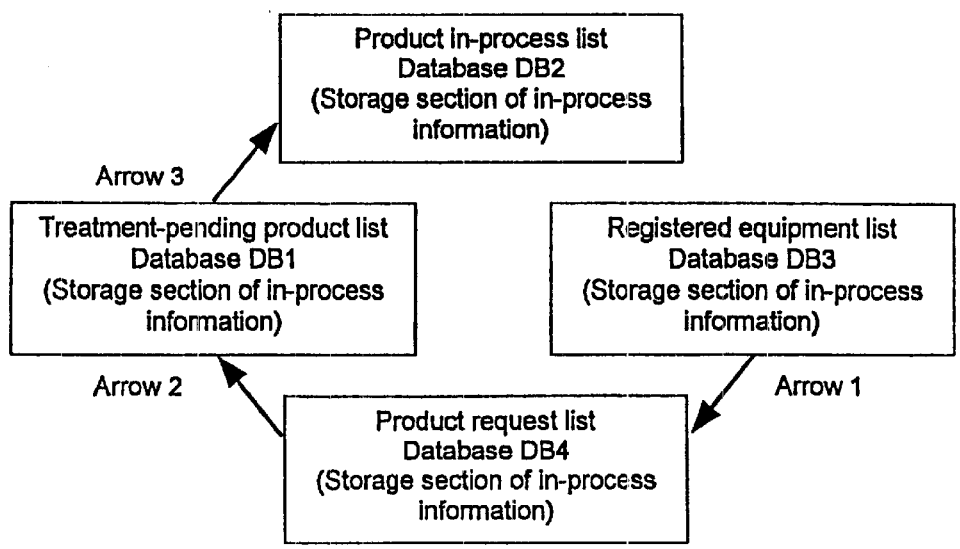
FIG. 6 is a drawing showing the relation between databases of the product in-process control in FIG. 5
Figure 7:
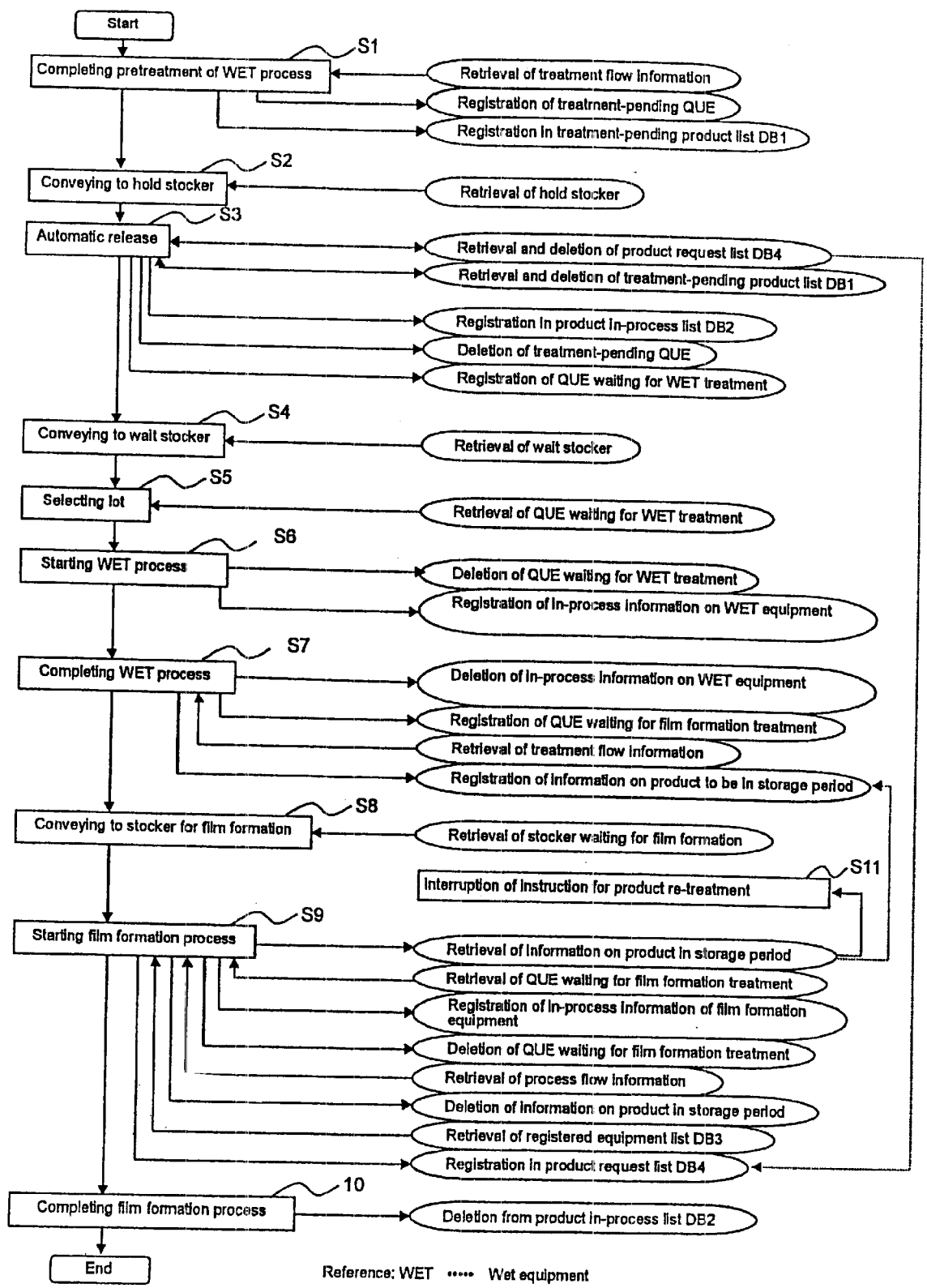
FIG. 7 is a detailed treatment flow diagram of the product in-process control based on FIG. 5 and FIG. 6.

Described hereinafter is a control method for product in-process control in the storage time observation section described above with reference to FIG. 1 and FIG. 2 using the mentioned process control apparatus. FIG. 5 is a flow diagram showing a treatment outline of the product in-process control using the process control apparatus in FIG. 3. FIG. 6 is a drawing showing the relation between databases of the product in-process control in FIG. 5. FIG. 7 is a detailed treatment flow diagram of the product in-process control based on FIG. 5 and FIG. 6.

First, basic flow of the in-process control is described. A lot being in process in the storage time observation section process is registered on the database list DB1 of products of which treatment is pending (hereinafter referred to as treatment pending product list DB1). Then, as shown in FIG. 5, the automatic control program selects a product having high priority of treatment and releases the treatment-pending state of the selected product (SEQ1). Then, the product which was released from the pending state is registered on the products in-process list DB2, the product treatment(SEQ2) in the storage time observation section process is conducted, and the product treatment(SEQ3) in the storage time observation process is started. In addition, the treatment in the storage time observation process is conducted using the equipment defined in the registered equipment list DB3. At the time of starting the treatment in the storage time observation process, the next product request is prepared and added to the product requests list DB4. The request includes at least information such as name of equipment, waiting time for the next product request, time of abandoning the combination of next product request, number of combined products, etc. which are registered in the registered equipment list DB3. Thus, a series of processes are repeated automatically.

In effect, the registered equipment list DB3 to be used in the storage time observation process is available as a database to be used in the in-process control. At the time of starting the treatment, the product requests list DB4 is prepared and additionally registered representing the product request including the treatment using the equipment for the next lot defined in the registered equipment list DB3. On the basis of the product request, the treatment-pending state of the next lot registered in the products pending treatment list DB1 is released. The lot released from the pending treatment state is registered as a lot in-process in the storage time observation section in the products in-process list DB2. Each database of these lists is available with their relation as shown in FIG. 6 and whose progress of the in-process control is shown in FIG. 5 under such mutual relation.

Described hereinafter is an in-process control method in the storage time observation section with reference to the detailed treatment flow diagram in FIG. 7. When completing the WET pre-process (S1), a completion report (ED) showing the completion of the WET treatment is sent from the wet pretreatment processing equipment. Upon receiving this report, the basic information (treatment flow information) is retrieved, and whether or not the next process is the storage time observation starting process is judged. If not, the lot is registered in the in-process information (pending treatment QUE). If it is so, the lot is registered in the in-process information (treatment pending product list DB1). Subsequently, the reference information (hold stocker) is retrieved and the corresponding lot is conveyed to the hold stocker (S2). Upon arriving at the hold stocker, an arrival completion report (ED) is conducted, whereby a flag indicating arrival at the hold stocker of the in-process information (treatment pending product list DB1) is raised and the lot waits for instruction of release from the pending state at the hold stocker.

On the other hand, when a treatment-pending release program is operated (regularly) and it is judged that there is any information in the in-process information (treatment pending product list DB1), the program retrieves the in-process information (treatment pending product list DB1), and confirms that there is a flag indicating arrival at the hold stocker raised for the product in the in-process information (treatment pending product list DB1). Then, when the in-process information (product request list DB4) is retrieved and it is judged that the in-pending information (product request list DB4) is over the previously specified time, an instruction for releasing from the pending state (automatic release) is issued (S3). Then, the in-process information (QUE waiting for WET treatment) and (treatment pending product list DB1) are registered, while the in-pending information (treatment pending product list DB1) and (QUE pending treatment) are deleted. Then, the basic reference (wait stocker) is retrieved and the lot is conveyed to the idle wait stocker (S4). Note that the arrow is drawn from "retrieval and deletion from the product request list DB4" to the later described "registration in the product request list DB4". This means that the lot in the state of pending treatment is put into the process in the storage time observation section in accordance with the predetermined sequence on the basis of procedures specified by "registration of the product request list DB4". Then, the wait stocker arrival report ED is delivered, and a flag indicating arrival at the hold stocker of the in-process information (QUE waiting for WET treatment) is raised and the lot waits for a product request from the WET equipment at the hold stocker.

When the WET equipment comes into the condition available for the treatment (waiting condition), the in-process information (QUE waiting for WET treatment) is retrieved. If it is confirmed that there is any information in the QUE waiting for WET treatment and a flag indicating arrival of the wait stocker is raised at the QUE waiting for treatment, the lot of which product request was issued from the WET equipment is selected (S5), is brought into the WET equipment, and the WET process is started (S6). Then, registration in the in-process information (WET equipment in-process information) and deletion from the in-process information (QUE waiting for WET treatment) are conducted. Upon completing the treatment using the WET equipment, the ED (treatment completion report) is delivered from the WET equipment, and deletion from the in-process information (WET equipment in-process information) and registration in the in-process information (QUE waiting for film formation treatment) are conducted.

When the ED (treatment completion report) is delivered from the WET equipment and the WET equipment comes into the condition available for the treatment (waiting condition), the in-process information (QUE waiting for WET treatment) is retrieved again in the same manner as mentioned above. If it is confirmed that there is information in the QUE waiting for WET treatment and a flag indicating arrival at the wait stocker is raised in the information of QUE waiting for WET treatment, the next product request is made from the WET equipment. Thereafter, the product request is repeated in accordance with the automatic program in the same manner.

When the ED (treatment completion report) is delivered from the WET equipment, the reference information (treatment flow information) is retrieved to judge whether or not the storage time (start) is established or not. If the storage period is established, the storage time is registered in the in-process information (information on the product subject to the storage time treatment). If the storage time is not established, the reference information (stocker waiting for film formation) is retrieved and the lot is conveyed to the stocker waiting for film formation (S8). Upon arriving at the stocker waiting for film formation treatment, arrival completion report ED is conducted, and a flag indicating the arrival at the stocker waiting for film formation treatment is raised to wait for a product request from the film formation equipment at the stocker waiting for film formation treatment.

When the film formation equipment comes into condition available for the treatment (waiting condition), the in-process information (QUE waiting for film formation treatment) is retrieved. If it is confirmed that there is any information in the QUE waiting for film formation treatment, and a flag indicating arrival at the stocker waiting for film formation treatment is raised, the product request is delivered from the film formation equipment. And the product waiting for treatment at the stocker waiting for film formation is selected and brought into the film formation equipment, thus the film formation process (storage time observation process) being started (S9). Then, registration in the in-process information (information on film formation treatment) and deletion of the in-process information (QUE waiting for film formation treatment) are conducted. Subsequently, the reference information (treatment flow information) is retrieved to judge whether or not the storage time (completion) is established or not. If the storage time is established, the in-process information (information on product subject to the storage time treatment) is deleted. Even if the storage time is not established, it is judged whether or not it is in the storage time observation starting process. If the reference information is in the storage time observation starting process, the reference information (registered equipment list DB3) is retrieved. If data are found in the reference information (registered equipment list DB3) in the name of the equipment by which the treatment has started, the data are registered in the in-process information (product requests list DB4) in the name of the equipment by which the treatment has started. Then, when completing the film formation treatment, the ED (treatment completion report) is delivered from the film formation equipment, and the in-process information (products in-process list DB2) is deleted, thereby completing a series of treatment processes of the lot (S10). On the other hand, the storage time observation program is operated (regularly) to retrieve the in-process information (information on product subject to the storage time treatment). If there is any in-process information (information on products subject to the storage time treatment) which is over the specified time $T_l$, an interruption for instructing retreatment of the product takes place (S11). Thus the lot is stored in the hold stocker and retreated in the same manner as described above.

When the ED (treatment completion report) is conducted and the film formation equipment comes into the condition available for the treatment (waiting condition), the in-process information (QUE waiting for film formation treatment) is retrieved again in the same manner as mentioned above. If there is any information in the QUE waiting for film formation treatment and a flag indicating arrival at the stocker waiting for film the film formation equipment, and the lot is selected from among products waiting for the treatment at the stocker waiting for the film formation. Thereafter, the product request is repeated in accordance with the automatic program in the same manner.

Figure 8:
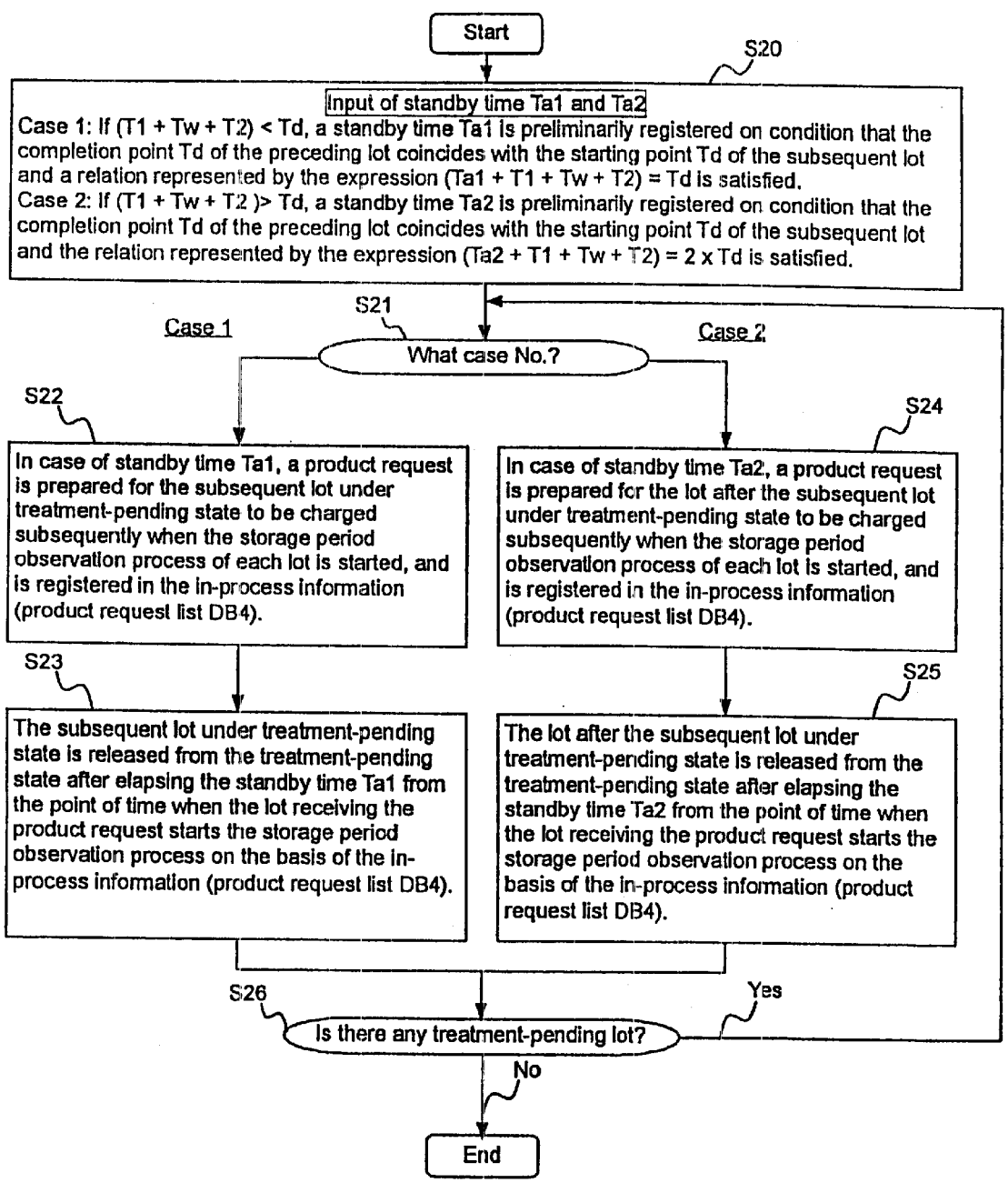
FIG. 8 is a flow chart showing a product in-process control method in the storage time observation section according to Embodiment 1 and Embodiment 2.

FIG. 8 is a flowchart showing an in-process control method in the storage time observation section including this Embodiment 1. In the in-process control method according to this Embodiment 1, it is supposed that, as described above with reference to FIG. 2, the processing time of the film formation equipment is very long as compared with the processing time of the WET equipment or the conveyance time. That is, Case 1 in the flowchart in FIG. 8 is supposed herein. Accordingly, in this process control method, control operation is conducted in the following sequential order. First, the standby time $Ta_1$ satisfying the conditions of Case 1 is preliminarily inputted using the terminal input device 2 in FIG. 3 and registered in the in-process information storage section 14 (S20). In this manner, an automatic program of the arithmetic unit control section 12 judges the case No. (S21), thereby Case 1 being selected. Then, when the storage time observation process for each lot is started and the product request for the next lot is prepared and registered in the in-process information (product requests list DB4) (S22), the treatment-pending state of the next lot is released by the automatic control program after elapsing the specified standby time Ta, from the time of starting the storage period observation process (S22) of the preceding lot. Then, the presence of any treatment-pending lot is checked (S26) and the mentioned flow from S21 through S26 is repeated until a lot to be treated is not found. Embodiment 2.

FIG. 9 is a diagram of treatment time schedule for each lot in the process flow of the storage time observation section according to Embodiment 2 of the invention. As shown in the drawing, this Embodiment 2 is different from the foregoing Embodiment 1 in the aspect that Embodiment 2 is applied to the case wherein treatment time in the film formation treatment is short as compared with total time of the conveyance time in the preceding process and the treatment time in the WET equipment and satisfies the condition of $T_1+Tw+T_2+Ta_2=2\times Td+T_1+Tw+T_2>Td$.

In this respect, $Ta_2$ indicates a standby time from the point of time (trigger point) when a lot of which pending state is released is charged from the starting time of the storage time observation process of the lot before the preceding lot. In the same manner as $Ta_1$, the standby time $Ta_2$ is established so that the point of time when the storage time observation process of the preceding lot has completed is substantially coincident with the point of time when the storage time observation process of the lot itself is started. In the operation, the lot 2 is charged after charging the lot 1. This is because, considering the timing such that the point of time when the lot 1 has completed the storage time observation process is coincident with the point of time when the lot 2 starts the storage time observation process, starting operation of $T_1$ for the lot 2, i.e., the treatment-pending state of the next lot at the hold stocker is manually released unlike other lots. However, each lot on and after lot 3 is charged sequentially in order by the automatic program. In this case, the start of the storage time observation process for each lot is utilized as a trigger for the release of the lot after the subsequent lot from the treatment-pending state.

That is, the point of time $TR_1$ when the storage time observation process of the lot 1 starts is utilized as a trigger for releasing the treatment-pending state of the lot 3. The point of time $TR_2$ when the storage time observation process of the lot 2 starts is utilized as a trigger for releasing the treatment-pending state of the lot 4. The point of time $TR_3$ when the storage time observation process of the lot 3 starts is utilized as a trigger for releasing the treatment-pending state of the lot 5. After elapsing the standby time $Ta_2$ from each trigger point, each lot is sequentially charged, and each lot is released from the treatment-pending state. As a result, in the mentioned operation, the same advantages as in the foregoing Embodiment 1 are conducted. FIG. 8 is a flowchart of the in-process control method in the storage time observation section including this Embodiment 2 and also shows how to achieve the mentioned in-process control.

That is, this Embodiment 2 corresponds to Case 2 shown in the flowchart of FIG. 8, and the operation is conducted in the following sequential order. First, the standby time $Ta_2$ satisfying the conditions of Case 2 is preliminarily inputted using the terminal input equipment 2 in FIG. 3 and registered in the information storage section 14 (S20). Thus, an automatic program of the arithmetic unit control section 12 judges the case No. (S21), and Case 2 is selected. When the storage time observation process for each lot is started and the product request for the lot after the subsequent lot is prepared and registered in the in-pending information (product request list DB4) (S24), the lot after the subsequent lot held in the pending treatment state is charged by the automatic control program after elapsing the specified standby time $Ta_2$ for the subsequent lot from the point of time when the lot before the preceding lot starts the storage time observation process, and released from the treatment-pending state (S25). Then, presence of treatment pending lot is checked (S26), and the mentioned flow from S21 through S26 is repeated until any treatment-pending lot is not found.

Note that, in the mentioned Embodiment 1 and Embodiment 2, an example of film formation equipment is shown for the storage time observation process. The invention, however, is not limited to such an example and is also applicable to ion implanter, diffusion equipment, etc. In addition, an example in which only the conveyance equipment is provided between the WET equipment and the film formation equipment in the foregoing embodiments. However, plural processes such as inspection equipment can also be interposed to which the invention is preferably applicable.

What is claimed is:

1. A process control method for processing a plurality of lots including a preceding lot and a subsequent lot in a process stage comprising a hold stocker for holding each lot in a standby state, pre-treatment processing equipment for pre-treating each lot brought out from the hold stocker based on a standby release order, and post-treatment processing equipment for post-treating each lot for which pre-treatment has been completed, wherein storage time for each lot between completion of pre-treatment in the pre-treatment processing equipment and start of post-treatment in the post-treatment processing equipment is limited, the process control method comprising:

establishing a standby time for the subsequent lot based on the treatment starting time for the preceding lot in the post-treatment processing equipment so that completion time of the post-treatment for the preceding lot in the post-treatment processing equipment may substantially coincide with the starting time of the post-treatment for the subsequent lot in the post-treatment processing equipment; and giving the standby release order for the subsequent lot after passage of the standby time utilizing start of treatment for the preceding lot in the post-treatment processing equipment as a trigger, wherein $T_1+Tw+T_2<Td$ and $Ta_1+Td-T_1-Tw-T_2$ are satisfied, when the preceding lot is a first lot and the subsequent lot is a second lot to be treated subsequently, and establishing that a time obtained by adding a conveyance time from the hold stocker to the pre-treatment processing equipment to a waiting time until start of the pre-treatment is $T_1$, treatment time in the pre-treatment processing equipment is Tw, the storage time is $T_2$, treatment time in the post-treatment equipment is Td, and the standby time for each lot for and after the second lot is $Ta_1$.

2. The process control method according to claim 1, wherein the second lot has a lot number subsequent to a lot number of the first lot.

3. A process control method for processing a plurality of lots including a preceding lot and a subsequent lot in a process stage comprising a hold stocker for holding each lot in a standby state, pre-treatment processing equipment for pre-treating each lot brought out from the hold stocker based on a standby release order, and post-treatment processing equipment for post-treating each lot for which pre-treatment has been completed, wherein storage time for each lot between completion of pre-treatment in the pre-treatment processing equipment and start of post-treatment in the post-treatment processing equipment is limited, the process control method comprising:

establishing a standby time for the subsequent lot based on the treatment starting time for the preceding lot in the post-treatment processing equipment so that completion time of the post-treatment for the preceding lot in the post-treatment processing equipment may substantially coincide with the starting time of the post-treatment for the subsequent lot in the post-treatment processing equipment; and giving the standby release order for the subsequent lot after passage of the standby time utilizing start of treatment for the preceding lot in the post-treatment processing equipment as a trigger, wherein $T_1+Tw+T_2>Td$ and $Ta_2-2\times Td-T_1-Tw-T_2$ are satisfied, when the preceding lot is a first lot and the subsequent lots are second and third lots to be treated subsequently, and establishing that a time obtained by adding a conveyance time from the hold stocker to the pre-treatment processing equipment to a waiting time until start of pre-treatment is $T_1$, treatment time in the pre-treatment processing equipment is Tw, the storage time is $T_2$, treatment time in the post-treatment equipment is Td, and the standby time for each lot for and after the third lot is $Ta_1$.

4. The process control method according to claim 3, wherein the third lot has a lot number subsequent to the lot number of the first lot.

5. A process control apparatus for processing a plurality of lots including a preceding lot and a subsequent lot, said apparatus comprising a hold stocker for holding each lot in a standby state, a pre-treatment processing equipment for pre-treating each lot brought out from said hold stocker based on a standby release order, and a post-treatment processing equipment for post-treating each lot for which pre-treatment has been completed, wherein storage time for each lot between completion of pre-treatment in said pre-treatment processing equipment and start of the post-treatment in said post-treatment processing equipment is limited, the process control apparatus further comprising:

an information storage section for storing information on a standby time for the subsequent lot based on the starting time of the treatment for the preceding lot in said post-treatment processing equipment so that completion time of post-treatment for the preceding lot in said post-treatment processing equipment may substantially coincide with the starting time of post-treatment for the subsequent lot in said post-treatment processing equipment, information on the treatment starting time for the preceding lot in said post-treatment processing equipment, and product request information for the subsequent lot;

a factory automation computer including an arithmetic unit control section for calculating the standby time for the subsequent lot in accordance with an automatic program using the information on the standby time, the information on the treatment starting time, and the product request information, and for transmitting a standby release order for the subsequent lot after passage of the standby time; and an equipment control terminal which transfers the standby release order to said pre-treatment processing equipment, wherein $T_1+Tw+T_2<Td$ and $Ta_1-Td-T_1-Tw-T_2$ are satisfied, when the preceding lot is a first lot and the subsequent lot is a second lot to be treated subsequently, and establishing that a time obtained by adding a conveyance time from said hold stocker to said pre-treatment processing equipment to a waiting time until start of pre-treatment is $T_1$, treatment time in said pre-treatment processing equipment is Tw, the storage time is $T_2$, treatment time in said post-treatment equipment is Td, and the standby time for each lot for and after the second lot is $Ta_1$.

6. The process control apparatus according to claim 5, wherein the second lot has a lot number subsequent to a lot number of the first lot.

7. A process control apparatus for processing a plurality of lots including a preceding lot and a subsequent lot, said apparatus comprising a hold stocker for holding each lot in a standby state, a pre-treatment processing equipment for pre-treating each lot brought out from said hold stocker based on a standby release order, and a post-treatment processing equipment for post-treating each lot for which pre-treatment has been completed, wherein storage time for each lot between completion of pre-treatment in said pre-treatment processing equipment and start of the post-treatment in said post-treatment processing equipment is limited, the process control apparatus further comprising:

an information storage section for storing information on a standby time for the subsequent lot based on the starting time of the treatment for the preceding lot in said post-treatment processing equipment so that completion time of post-treatment for the preceding lot in said post-treatment processing equipment may substantially coincide with the starting time of post-treatment for the subsequent lot in said post-treatment processing equipment, information on the treatment starting time for the preceding lot in said post-treatment processing equipment, and product request information for the subsequent lot;

a factory automation computer including an arithmetic unit control section for calculating the standby time for the subsequent lot in accordance with an automatic program using the information on the standby time, the information on the treatment starting time, and the product request information, and for transmitting a standby release order for the subsequent lot after passage of the standby time; and an equipment control terminal which transfers the standby release order to said pre-treatment processing equipment, wherein $T_1+Tw+T_2>Td$ and $Ta_2=2\times Td-T_1-Tw-T_2$ are satisfied, when the preceding lot is a first lot and the subsequent lots are second and third lots to be treated subsequently, and establishing that a time obtained by adding a conveyance time from said hold stocker to said pre-treatment processing equipment to a waiting time until start of pre-treatment is $T_1$, treatment time in said pre-treatment processing equipment is Tw, the storage time is $T_2$, treatment time in said post-treatment equipment is Td, and the standby time for each lot for and after the third lot is $Ta_1$.

8. The process control apparatus according to claim 7, wherein the third lot has a lot number subsequent a lot number of the first lot.

* * * * *